United States Patent [19]

Maas et al.

[11] Patent Number: 4,717,689

[45] Date of Patent: Jan. 5, 1988

[54] METHOD OF FORMING SEMIMICRON GROOVES IN SEMICONDUCTOR MATERIAL

[75] Inventors: Henricus G. R. Maas; Johannes A. Appels, both of Eindhoven, Netherlands

[73] Assignee: U.S. Philips Corporation, New York, N.Y.

[21] Appl. No.: 776,330

[22] Filed: Sep. 16, 1985

[30] Foreign Application Priority Data

Sep. 18, 1984 [NL] Netherlands .................. 8402859

[51] Int. Cl.⁴ .................................................. H01L 21/76
[52] U.S. Cl. ................................... 437/225; 437/233; 437/235; 437/238; 437/241; 437/41; 437/67; 437/162; 437/186; 437/919; 156/628; 156/653; 156/657
[58] Field of Search ............... 148/DIG. 51; 156/653, 156/628, 657; 29/576 W, 576 B

[56] References Cited

U.S. PATENT DOCUMENTS

| | | | |
|---|---|---|---|
| 3,536,547 | 10/1970 | Schmidt | 148/DIG. 51 |
| 4,053,349 | 10/1977 | Simko | 156/628 |
| 4,108,715 | 8/1978 | Ishikawa | 156/662 |
| 4,274,909 | 6/1981 | Verkataraman et al. | 29/576 W |
| 4,449,287 | 5/1984 | Maas et al. | 29/580 |
| 4,463,493 | 8/1984 | Momose | 156/628 |
| 4,514,251 | 4/1985 | Van Ommen et al. | 29/571 |
| 4,545,114 | 10/1985 | Ito et al. | 29/576 B |
| 4,601,778 | 7/1981 | Robb | 156/657 |

FOREIGN PATENT DOCUMENTS

| | | | |
|---|---|---|---|
| 0076942 | 4/1983 | European Pat. Off. | 156/628 |
| 0093343 | 6/1983 | Japan | 29/580 |
| 0175847 | 10/1983 | Japan | 29/571 |
| 2030002 | 3/1980 | United Kingdom | 156/628 |

OTHER PUBLICATIONS

Kendall, "An Etching Very Narrow Grooves in Silicon", vol. 26 (1975), p. 198.

*Primary Examiner*—Brian E. Hearn
*Assistant Examiner*—Kevin McAndrews
*Attorney, Agent, or Firm*—Paul R. Miller

[57] ABSTRACT

On a layer having a stepped relief, such as a masking layer (4) having openings (5) on a substrate region, (2) a first layer (6) is provided, which, while maintaining the stepped relief, is covered by a second masking layer (8) and a convertible layer (9). By conversion of the convertible layer (9) (by means of ion implantation, oxidation, silicidation) this layer becomes selectively etchable. After removal of the non-converted parts, an intermediate mask (8) is formed with an opening in the second masking layer (8) along the edge of a depression (7). By means of the mask (8) thus obtained, grooves (11) are formed by anisotropic etching in the first layer (6) and in the subjacent substrate region (2) if required. When grooves are formed in a substrate region (2) of semiconductor material, these grooves may be filled with oxide (25) for forming insulated regions. If a first layer (6) of polycrystalline silicon is used on a substrate region (2) of silicon, this layer (6) can serve as a doping source and a connection, respectively. Thus, various kinds of transistors (MOSFET and bipolar transistors) can be manufactured. The second masking layer (8) and the convertible layer (9) may be realized, if required, as a single layer (65).

35 Claims, 46 Drawing Figures

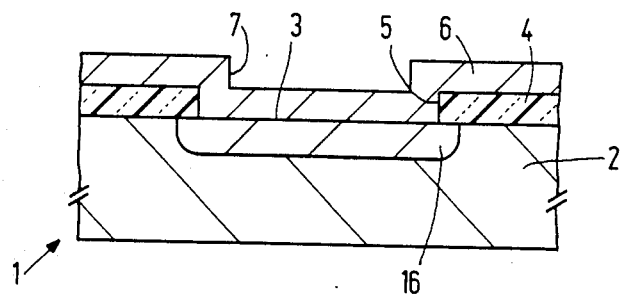
FIG.1
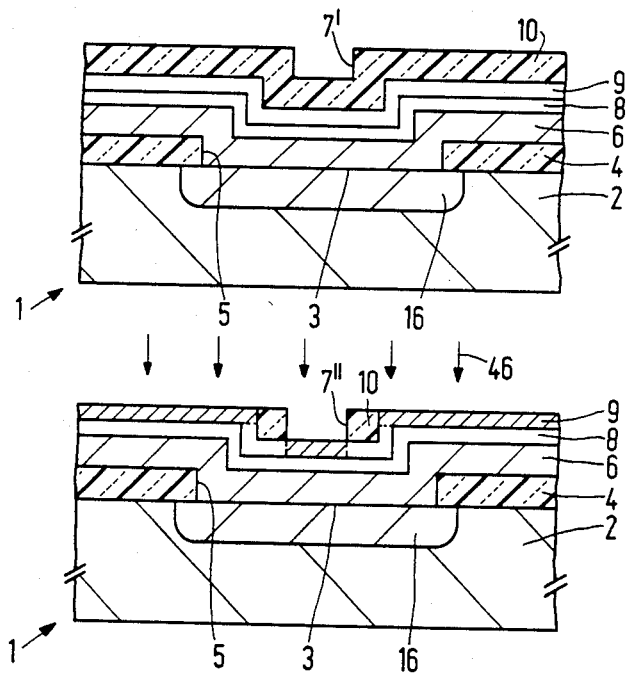
FIG.2
FIG.3
FIG.4

METHOD OF FORMING SEMIMICRON GROOVES IN SEMICONDUCTOR MATERIAL

BACKGROUND OF THE INVENTION

The invention relates to a method of forming at least one narrow groove in a substantially uniform layer of a first material, in which the width of the groove is determined in a self-registered manner.

The invention more particularly relates to the manufacture of a semiconductor device by means of such a method.

The invention also relates to a device manufactured by means of a method according to the invention.

When designing semiconductor devices, increasingly higher integration densities are aimed at on the one hand in order to be able to realize an increasing number of functions on the same surface and on the other hand in order to be able to obtain higher yields in the manufacture due to the smaller surface area of the circuit to be manufactured. Especially due to the rise of microprocessors and mini-computers, increasingly more stringent requirements are imposed with respect to high speed and small dimensions of the circuit elements. Consequently, increasingly more stringent requirements are imposed on the minimum dimensions to be realized, such as track widths of metallization patterns, relative distances of contact holes, minimum widths of insulation regions etc.

Since these dimensions are determined for the major part by the masking techniques used, there is an increasing interest in finding methods, in which these dimensions are not dependent upon optical resolution; and especially self-registered techniques are to be preferred.

A method of the kind mentioned in the opening paragraph is known from British Patent Application No. 2,111,304 A. In this case, a groove of submicron dimensions is formed in a self-registered manner in a substrate region, such as, for example, a semiconductor substrate. Semiconductor elements, such as, for example, transistors are then provided in substrate regions mutually separated by insulation regionns defined by means of these grooves. However, again photolithographic methods are used.

Besides, in one of the embodiments, the width of the ultimate groove is determined by oxidation of two different layers, whose relative distance is determined in the first instance by lateral oxidation of one of the layers. Due to alignment tolerances, transistors manufactured by means of this method are bound to certain minimum dimensions.

A method according to the invention is characterized in that a substrate region is provided at a major surface with a first masking layer having at least one opening or depression and the surface is provided at least at the area of the opening and on an adjoining part of the masking layer with a substantially uniform layer of the first material having a depression at the area of the opening, while the layer of the first material is covered by a substantially uniform layer of a second masking material and a substantially uniform layer of a first convertible material, and in that within the original opening in the first masking layer the depression in the layers of the second masking material and the first convertible material is maintained and selective conversions, such as by ionic implantations, for example, of the first layer of convertible material is effected for the formation of an intermediate mask, by means of which an opening is formed at least along the inner edge of the depression in the layer of the second masking material, after which the groove in the layer of the first material is obtained by means of the mask thus formed in the layer of the second masking material.

A substantially uniform layer is to be understood herein to mean a layer having substantially the same thickness throughout its area except areas at which an unevenness, such as, for example, a step, is present in the subjacent layer and the uniform layer has the same profile as the subjacent layer.

The term opening or depression is not necessarily to be understood to mean an opening in the first masking layer, which is surrounded on all sides by this masking layer. A masking layer may also be used which exposes the substrate region.

The invention is based on the recognition of the fact that, when such a groove is formed along the edge of the opening, especially in semiconductor devices, such as integrated circuits, semiconductor zones, such as, for example, an emitter and base-connections having extremely small dimensions (in the submicron range) can be formed within this opening in the layer of the first material, which may be, for example, polycrystalline silicon.

The intermediate mask may be formed, for example, by choosing for the first convertible layer a semiconductor material which is converted into oxide at least along a part of, the inner edge of the depression by means of local oxidation which oxide is then removed so that the remaining semiconductor material constitutes the intermediate mask.

Preferably, however, the first convertible layer is covered by a substantially uniform layer of a third masking material, which is subjected to an anisotropic etching treatment, and a third masking layer, which protects the first convertible layer against conversion, remains at least along the inner edge of the depression on the first convertible layer.

Depending upon the materials used, various forms of conversion are possible, such as, for example, local oxidation or silicidation, after which the non-converted part is removed.

A preferred embodiment of the method according to the invention is characterized in that the first convertible layer comprises polycrystalline semiconductor material, which is converted along the inner edge of the depression by means of a doping step into highly doped semiconductor material. The highly doped semiconductor material is substantially not attacked when the original semiconductor material is etched.

In a particular advantageous embodiment of the method according to the invention, the second masking layer may even coincide with the first convertible layer. Such a method is characterized in that a substrate region is provided at a major surface with a first masking layer having at least one opening and in that the device is provided at least at the area of the opening and on an adjoining part of the masking layer with a substantially uniform layer of a first material having a depression at the area of the opening, while the layer of the first material is covered by a substantially uniform layer of a second masking material with, the depression being maintained within the original opening in the first masking layer and selective conversion of the second masking layer being effected, in which at least along the inner edge of the depression, the second masking layer is etched while the remaining part of the second masking layer remains so that, after this part which is etched has been removed, a mask is obtained by means of which the groove is formed in the layer of the first material.

By means of the method according to the invention, various kinds of transistors and circuits can be realized in semiconductor materials, for example by forming depressions in the substrate region in the manner described in the aforementioned British Patent Application, while using the uniform layer of the first material with grooves formed therein as a mask.

Another method of manufacturing a semiconductor body is characterized in that the first material comprises a semiconductor material and the second masking material comprises an oxidation-preventing material, while after etching the groove down to the surface, the oxidationpreventing material located outside the depression is removed and the semiconductor material is oxidized over such a distance that the groove is filled entirely or in part with oxide.

Thus, a semiconductor region of extremely small dimensions enclosed by a groove can be formed, which defines, for example, in a bipolar transistor the size of the emitter zone and the base connection, or defines in a field effect transistor the size of a connection contact of the source zones and the gate electrodes.

Furthermore, quite different devices, such as, for example, a capacitor, can be manufactured by means of the method according to the invention.

BRIEF DESCRIPTION OF THE DRAWINGS

The invention will now be described more fully with reference to a few embodiments and the drawing, in which:

FIGS. 1 to 8 and 5a to 5b show a method according to the invention,

FIGS. 36 to 38 show another method according to the invention, while

Figures 5A, 5B:
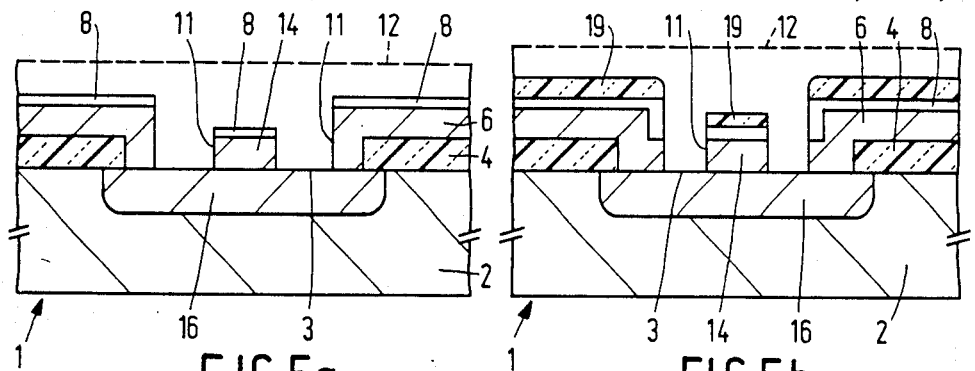

The figures are not drawn to scale, while for the sake of clarity especially in the cross-sections the dimensions in the direction of thickness are greatly exaggerated. Semiconductor zones of the same conductivity type are generally cross-hatched in the same direction; and in the Figures corresponding parts are generally designated by the same reference numerals.

DESCRIPTION OF THE PREFERRED EMBODIMENTS

FIGS. 1 to 8 show the manufacture of a bipolar transistor by means of a method according to the invention.

In this embodiment, the device 1 comprises an n-type semiconductor substrate 2 (see FIG. 1) having a resistivity of 20–100 $\Omega$.cm and is provided at a major surface 3 with a first masking layer 4, which is formed photolithographically and consists in this embodiment of silicon oxide. At the area of an opening 5 having substantially perpendicular side walls in the masking layer 4, the substrate region 2 is provided with a surface zone 16 of the p-type. This surface zone has a surface resistance of about 500$\Omega$ per square and is obtained, for example, by diffusion or ion implantation while using the oxide 4 as a mask.

According to the invention, a substantially uniform layer 6 consisting in this embodiment of polycrystalline silicon is formed on the substrate region 2 within the opening 5 and on the adjoining oxide 4. This is effected by means of a deposition step from the vapour phase at low pressure (LPCVD) or by means of epitaxy from the vapour phase. As a result, a substantially uniform coating of the device is obtained with the layer 6 having a thickness of 0.4 $\mu$m and, which has within the opening 5 a depression 7 with substantially perpendicular side walls. THe layer of polycrystalline silicon is in this embodiment of the p-type and may serve, if required, as a diffusion source for forming the surface zone 16.

By means of deposition techniques similar to those used for providing the layer 6, a second masking layer 8 consisting, for example, of silicon nitride and having a thickness of 50 nm, a first convertible layer 9 consisting in this embodiment of polycrystalline silicon and having a thickness of 50 nm and a third masking layer 10 consisting, for example, of silicon oxide and having a thickness of 0.4 $\mu$m are then provided (see FIG. 2). During the successive deposition steps, the original profile, which is determined by the depression 7 (now denoted by reference numeral 7'), is maintained so that, when at a next stage the layer 10 is subjected to an anisotropic etching treatment, for example, reactive ion etching, this layer is removed substantially throughout the area except at the edges of this depression. As shown in FIG. 3, a mask 10 is then obtained, which protects in a next step the layer 9 of polycrystalline silicon against conversion.

In this embodiment, conversionn of the polycrystalline silicon layer 9 takes place due to the fact that this layer is locally converted into highly doped polycrystalline silicon of the p-type, for example by means of a heavy boron diffusion or by ion implantation with borofluoride or boron ions, indicated diagrammatically by arrows 46.

Subsequently, the remaining oxide 10 is removed by chemical etching, after which the device is subjected to an etching treatment in potassium hydroxide (KOH). The undoped polycrystalline silicon 9 soluble in (KOH) and thus etched away very rapidly, while the highly doped part of the layer 9 is substantially not attacked and constitutes an intermediate mask.

After this etching treatment, the device shown in FIG. 4 is obtained, in which the second masking layer 8 of silicon nitride is partly exposed and can be removed in situ by etching an phosphoric acid while using the layer 9 as an intermediate mask. The remaining nitride 8 acts as an etching stopper during a subsequent anisotropic etching treatment, such as, for example, plasma etching or reactive ion etching. The polycrystalline silicon layer disposed on the second masking layer 8 of nitride is then removed entirely, while one or more grooves 11, whose side walls are substantially at right angles to the surface 3 of the substrate region 2, are etched into the uniform layer 6. In this embodiment, a square or circular groove 11 is formed, which encloses a part 14 of the layer 6. At the area of the grooves 11, the surface 3 of the substrate region may also be slightly damaged by the etching treatment, but this does not entail serious consequences, as will be described hereinafter.

After etching, the device of FIG. 5a is obtained, which is then covered completely by photo-lacquer, after which the assembly is subjected to a planarization treatment, indicated diagrammatically by the broken line 12.

In a next processing step, the photolacquer is etched back together with the nitride 8 by means of reactive ion etching. The etching rate of the photolacquer may be higher provided that, after the nitride 8 outside the opening 5 has been removed, the nitride 8 remains present on the polycrystalline silicon 14 located within this opening. After the photolacquer remaining in the groove 11 has been removed by wet-chemical etching, the remaining nitride 8 protects in a subsequent oxidation step the subjacent polycrystalline silicon 14 against oxidation. In this oxidation step, the groove 11 is closed entirely or in part by oxidation, while also the upper side of the layer 6 outside the opening 5 is covered by oxide 13 (see FIG. 6). At the same time, when the groove 11 is closed by oxidation, the substrate region 2 is oxidized, especially at those areas at which due to the preceding etching treatment this substrate could be attacked; thus, any harmful influences of this etching step are eliminated.

Figure 8:
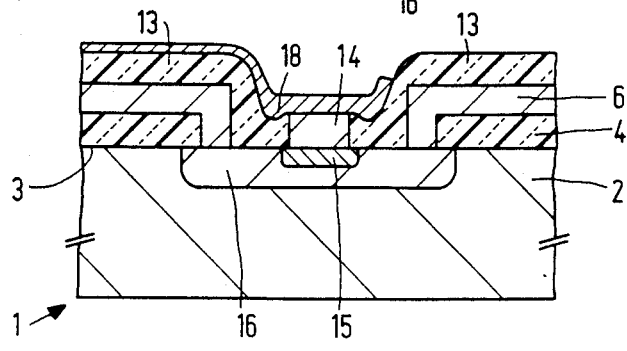
Figure 9:
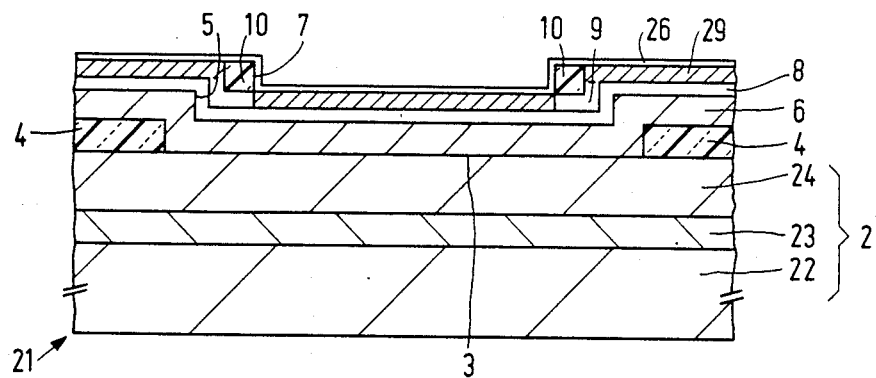
FIGS. 9 to 13 show a method according to the invention of manufacturing a semiconductor device.

Subsequently, the remaining nitride 8 is removed at the area of the part 14 from the polycrystalline silicon, after which this part 14 is doped by diffusion with impurities which cause the n-conductivity type, such as, for example, phosphorus. The diffusion is continued until an n-type region 15 has formed in the p-type region 16, which n-type region acts as the emitter zone in the present embodiment (see FIG. 7). The p-type region 16 acts as the base zone and is contacted by polycrystalline silicon layers 6. In this embodiment, the substrate region 2 acts as the collector. Contacting thereof may take place, for example, on the lower side, but also, if the substrate region 2 consists of several layers of alternate conductivity types, by a buried layer and a collector contact diffusion on the upper side. Finally, the assembly is covered by a metal layer of, for example, aluminium, which is then patterned so that an emitter contact metallization 18 is obtained, which contacts the emitter zone 15 by the polycrystalline part 14. Thus, the device shown in FIG. 8 is obtained.

Figure 6:
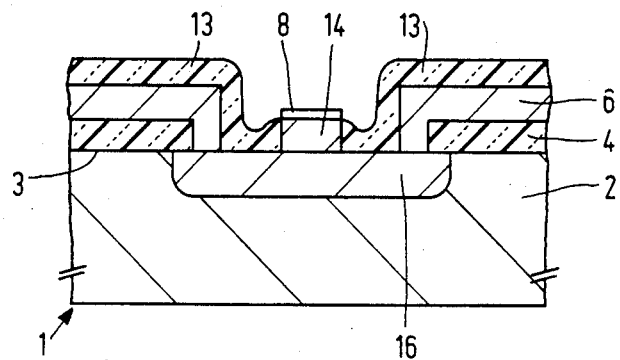
Figure 7:
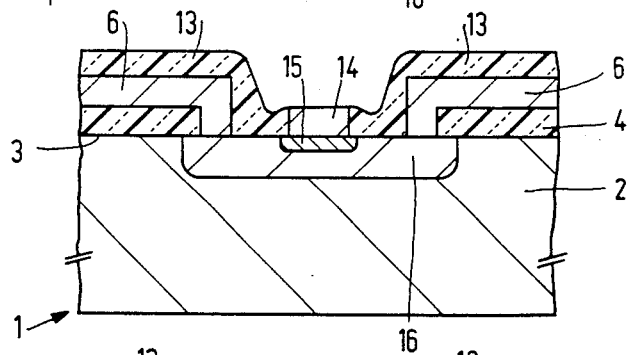

In a modification of the method described above, in the device of FIG. 4 an oxidation step is carried out, as a result of which the polycrystalline silicon 14 is oxidized to an oxide layer 19. While using this oxide 19 as a mask, the exposed nitride 8 and then the polycrystalline silicon 6 are etched anisotropcially so that again grooves 11 are formed (see FIG. 5b). Subsequently, again a photolacquer layer is provided, which is planarized, after which the assembly is etched back until the oxide 19 outside the depression 7 is exposed. The latter is then removed by chemical etching or by a continued back-etching so that the nitride 8 outside the depression is exposed and is removed, for example, by chemical etching. At the area of the part 14 of polycrystalline silicon, the double layer of nitride 8 and oxide 19 is maintained. In a manner similar to that described above, the groove 11 is now again closed by oxidation. After the remaining part of the oxide 19 has been removed by a light dip-etching step in buffered hydrofluoride, again the device of FIG. 6 is obtained.

FIGS. 9 to 13 show how insulation regions are formed between various semiconductor regions in a device 21 by means of a method according to the invention. The substrate region 2, on which the first masking layer 4 of oxide is formed is composed in this case of a semiconductor substrate 22 of the p-type having a resistivity between 10 and 100 $\Omega$.cm, a highly doped n-type buried layer 23 and a p-type epitaxial layer 24. Again uniform layers of polycrystalline silicon 6, silicon nitride 8 and polycrystalline silicon 9 are formed on the surface 3 within the opening 5 in the masking layer 4 and on the masking layer, while an oxidation mask 10 protecting the layer 9 along the edge of the depression 7 against conversion is formed thereon in a manner analogous to the method shown in FIGS. 2 and 3. The conversion in this case takes place by silicidation of the non-protected polycrystalline silicon. For this purpose, the surface of the device 21 is entirely covered by a layer 26 of a metal which forms a silicide with the polycrystalline silicon 9. For this purpose, for example, a platinum layer is used having a thickness of about 100 nm, which is applied by sputtering. Upon heating to about 450° C., the platinum reacts with the polycrystalline silicon and forms on the nitride 8 a layer 29 of platinum silicide except along the edge of the depression 7 at which polycrystalline silicon 9 remains (see FIG. 9). The remaining platinum is removed in a bath of aqua regia.

Figure 10:
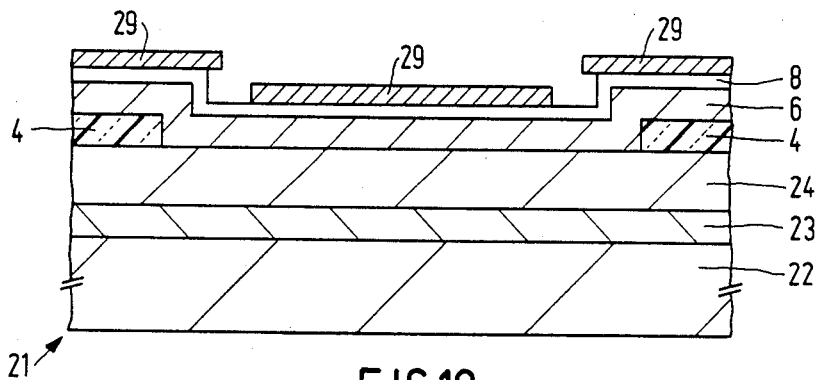
Figure 11:
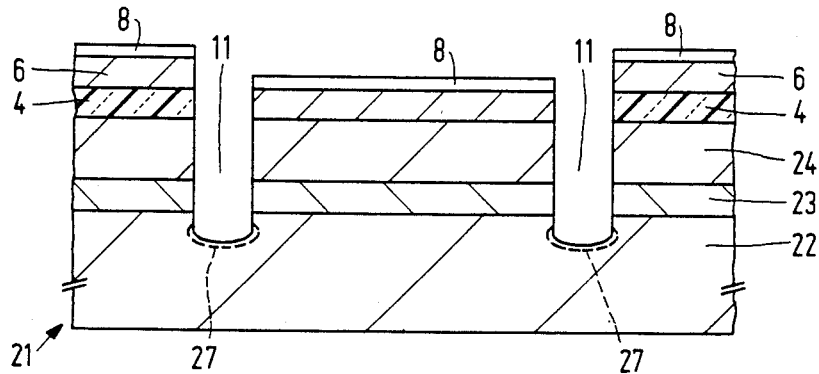

After wet-chemical treatment, first, the oxide 10 is removed, for example, in buffered hydrofluoride, and then the non-silicidized polycrystalline silicon 9 thus exposed is removed, for example, in a diluted HF-HNO$_3$ solution, and the device of FIG. 10 is obtained.

At the area of the edge of the depression 7, the nitride 8 is removed by wet-chemical etching in phosphoric acid while using the platinum silicide 29 as a mask, whereupon the platinum silicide 29 is removed in an etching bath.

While using the nitride 8 as a mask, a groove 11 is now etched by anisotropic etching, for example, reactive ion etching.

This etching treatment is continued down to such a depth that the groove 11 extends into the substrate 22. For any channel stopper regions to be provided, the substrate 22 is doped by means of ion implantation with, for example, boron ions while using the nitride 8 as a mask at the area of the grooves 11, which is indicated diagrammatically by the broken lines 27 in FIG. 11.

Figure 12:
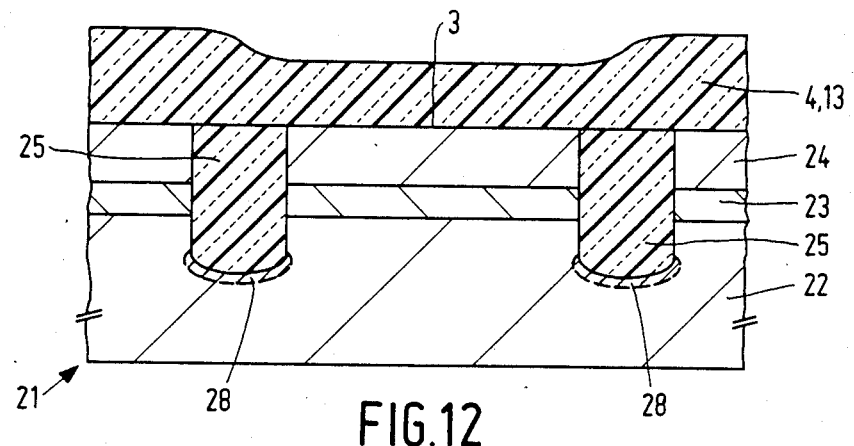

Subsequently, in FIG. 12 oxidation step is carried out, as a result of which the grooves 11 are filled at least in part with oxide 25. During this oxidation step, also the polycrystalline silicon 6 is converted into oxide 13 after the nitride 8 has been removed. During the oxidation, channel stopper regions 28 are formed below the oxide 25. In the case in which the grooves 11 are not filled entirely with oxide 25, if required, polycrystalline silicon may be provided in these grooves in order to obtain a flat surface. Thus, the device of FIG. 12 is obtained.

Figure 13:
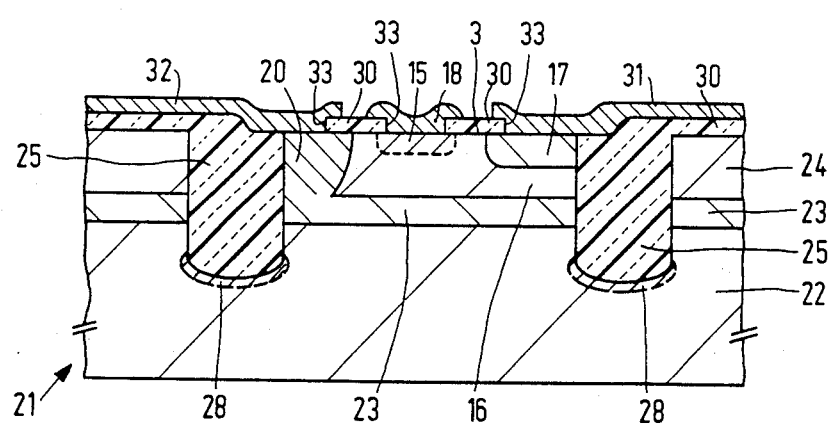

After the device has again been subjected to a planarization treatment with photolacquer, the assembly is etched back until a thin oxide layer remains on the surface 3. Although this thin oxide layer can be maintained, it is preferably removed by means of a light dip-etching step, after which a thermal oxide 30 having a thickness of 0.1 $\mu$m is formed over the surface 3, while the polycrystalline silicon that may be provided in the grooves 11 is also oxidized. In the regions insulated by oxide 25, a base contact zone 17 for contacting a base zone 16, a collector contact zone 20 for contacting the buried layer 23 acting as the collector and an emitter zone 15 are than provided in a generally known manner. The regions are contacted through contact holes 33 by a base metallization 31, a collector metallization 32 and an emitter metallization 18, respectively, and then the device shown in FIG. 13 is obtained.

Figure 14:
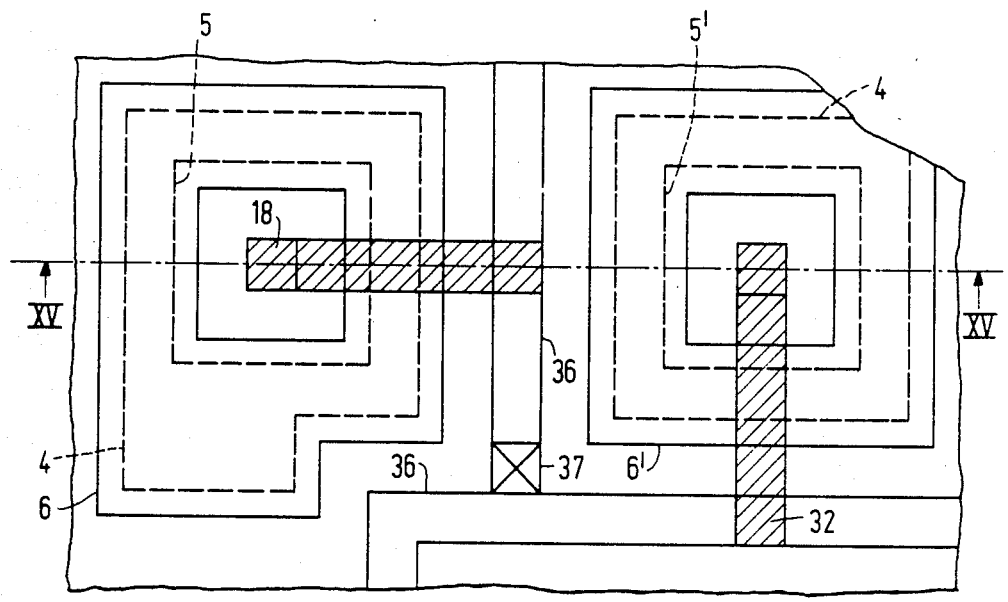
FIG. 14 shows a plan view and FIG. 15 shows in cross-section taken on the line XV—XV a semiconductor device manufactured by means of a method according to the invention.
Figure 15:
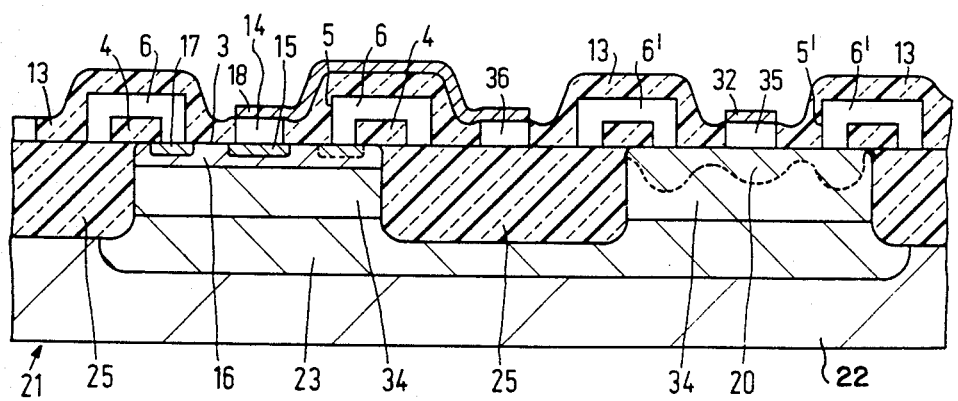

FIGS. 14 and 15 show a semiconductor device 21 manufactured by means of the method described with reference to FIGS. 1 to 8.

In this case, the starting material is a substrate region comprising a p-type substrate 22, an n-type buried layer 23 and a p-type epitaxial layer 34. In a generally known manner, for example by etching grooves and a subsequent oxidation of these grooves, regions insulated by oxide 25 are formed. In one of these regions, a p-type base zone 16 is provided either by means of ion implantation or diffusion or by means of the processing steps as described with reference to FIGS. 1 to 8.

On the surface 3 again parts of a masking layer 4 of oxide are disposed, on which the layers 6,6' of polycrystalline silicon are formed, which are p-doped at the area of the base zone 16 (reference numeral 6) and are n-doped at other areas in this embodiment (reference numeral 6'). Diffusion from these polycrystalline silicon layers has formed the base contact zones 17 and the collector contact zones 20, respectively. At the area of the collector contact zone 20, beforehand a heavy doping with n-type impurities may have taken place. A part 35 of the layer 6' enclosed by oxide 13 remains in the opening 5' at the area of the collector metallization 32. This layer 6' is heavily doped, just like the part 14 at the area of the emitter zone 15, with n-type impurities at the last stage of the method. Otherwise, the reference numerals have the same meaning as in the preceding embodiments.

It appears from the plan view of FIG. 14 that the opening 5 is entirely enclosed at the area of the base zone 16 of p-type polycrystalline silicon 6. The base zone 16 can be connected with other elements by giving this layer 6 a defined pattern. Alternatively, a contact hole may be provided in the oxide 13 for contacting the layer 6 with, for example, an aluminium track. Likewise, the opening 5' is entirely enclosed at the area of the collector contact zone 20 by an n-type polycrystalline silicon layer 6', which contacts the collector contact zone 20. In this case, consequently, two kinds of contacting are possible, i.e. by the polycrystalline silicon 6' and via the collector metallization 32. Such a double contacting may be advantageous in given circumstances.

It further appears from the plan view of FIG. 14 that tracks 36 of polycrystalline silicon are disposed between the regions 6,6' of polycrystalline silicon. These tracks may be used for interconnection and may be provided, if required, with interruptions 37, as indicated, for example by etching or selective oxidation of parts of the tracks 36.

Figure 16:
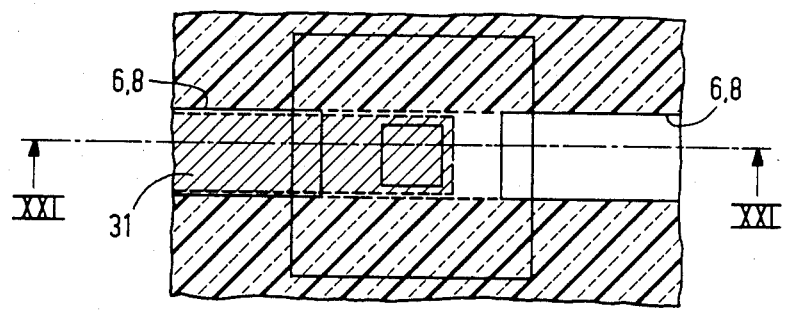
FIG. 16 to 21 show the manufacture of a bipolar transistor by means of a method according to the invention.

FIG. 16 shows a plan view of a transistor in a process with diffused collector insulation manufactured by means of a method as described with reference to FIGS. 17 to 21, which show cross-sections of the device taken on the line XXI—XXI in FIG. 16 at successive stages of the method.

Figure 17:
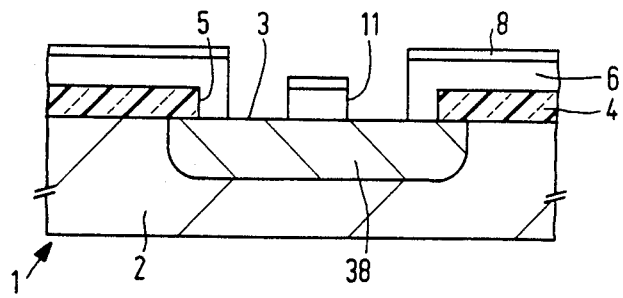

FIG. 17 substantially entirely corresponds to FIG. 5 with the understanding that the device 1 now comprises a p-type substrate region 2, in which an n-type collector zone 38 is formed through the opening 5 in the oxide layer 4 by means of diffusion or ion implantation. The nitride 8 is patterned outside the opening 5, as indicated in FIG. 16. By anisotropic etching treatment (reactive ion etching), in this embodiment the layer 6 of polycrystalline silicon is also given a similar pattern with the polycrystalline silicon 6 remaining along two opposite edges of the opening 5, as indicated in FIG. 16. Another possibility of obtaining such patterns of polycrystalline silicon not entirely surrounding the opening 5 consists in that the polycrystalline silicon 6 is oxidized selectively while using the patterned nitride 8 as an oxidation-preventing mask.

Figure 18:
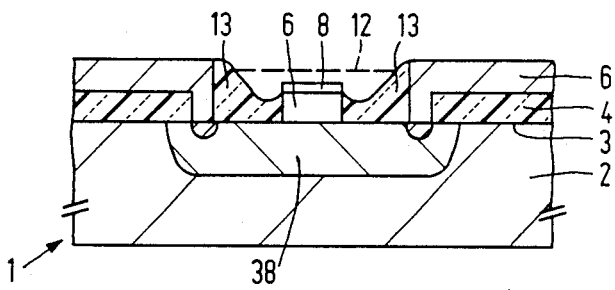
Figure 19:
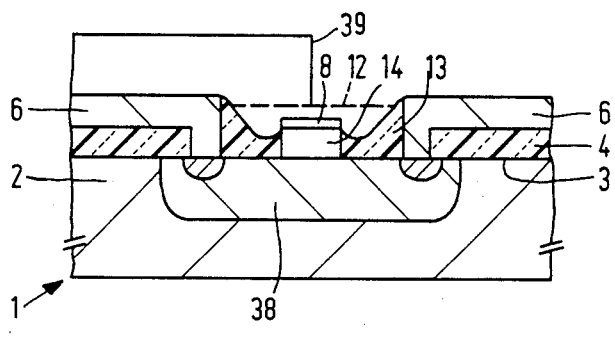

In the device of FIG. 17, after, as the case may be, a boron implantation has first been carried out, the groove 11 is closed by oxidation, as a result of which oxide 13 is formed. In the subsequent step, after planarization with photolacquer, it is etched back until the nitride 8 located outside the opening 5 has been removed and the device is still protected by photolacquer within the opening, as shown diagrammatically by the broken line 12 in FIG. 18. The exposed polycrystalline silicon 6 then becomes p-type conducting by a boron diffusion. Thus, the device of FIG. 18 is obtained.

Figure 20:
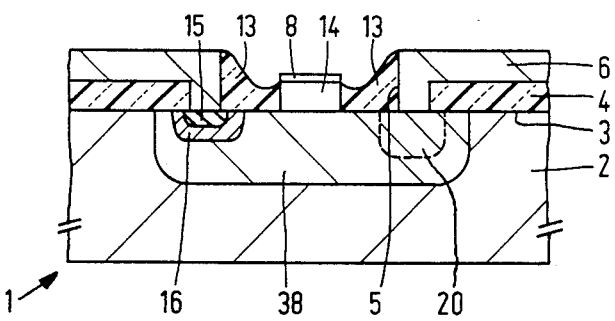

While a part of the device 1 is covered by a photomask 39 (FIG. 19), the exposed polycrystalline parts 6 and tracks are doped with phosphorus, after which the photomask 39 is removed again and the polycrystalline silicon is subjected to a heavy arsenic doping. During a subsequent heat treatment, the edges of polycrystalline silicon act as a diffusion source. Thus, an $n^+$-emitter zone 15 is obtained in a p-type base zone 16 (FIG. 20). At the same time, the phosphorus overdopes the boron and forms a collector contact zone 20. Thus, the device of FIG. 20 is obtained.

Figure 21:
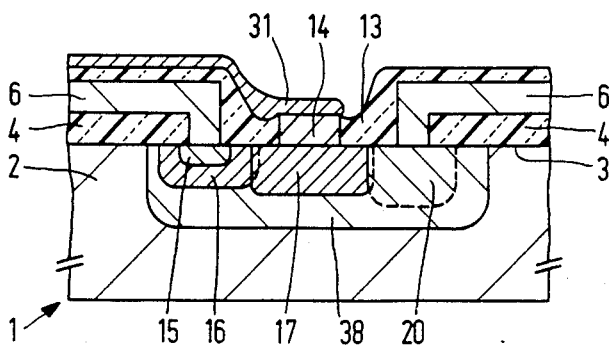

In a next step, the polycrystalline silicon 6 on the oxide 4 is oxidized on the upper side, after which the remaining nitride 8 is removed within the opening 5 so that by the remaining polycrystalline silicon 14 p-type impurities can be diffused into the semiconductor body for forming a base contact zone 17. After a base contact metallization 31 has been provided photolithographically in a generally known manner, the device of FIG. 21 is obtained as a transistor comprising a collector zone 38 and a collector contact zone 20 contacted by a polycrystalline silicon track 6. The transistor further comprises an emitter zone 15, also contacted by a polycrystalline silicon track 6, and a base zone 16 which is connected through the base contact zone 17 and the polycrystalline silicon 14 to the contact metallization 31.

A variation of this method, in which a low base-collector capacitance is obtained, is shown in FIGS. 22 to 27.

Figure 22:
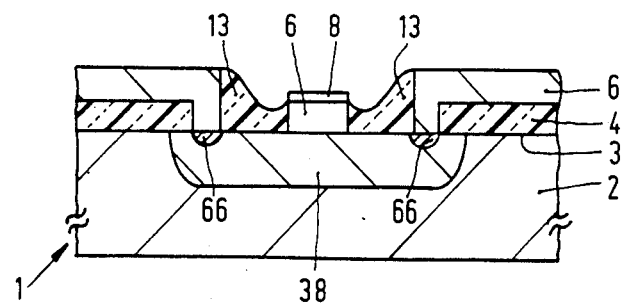
FIGS. 22 to 27 show a variation thereof.
Figure 23:
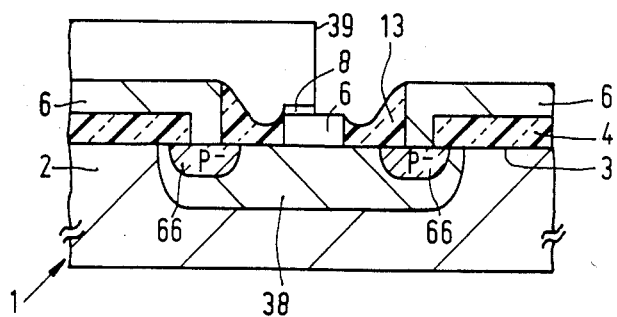

If in the device of FIG. 17 the polycrystalline silicon layers 6 located on the edges are previously doped with boron, p-type regions 66 are formed during the step of closing the grooves 11 with oxide 13 due to the fact that the boron diffuses from the layers 6 into the semiconductor body 2. After the photolacquer used for the planarization has been removed, in which step the polycrystalline layers 6 outside the depression 7 are exposed, these layers are provided, if required, by means of, for example, an arsenic implantation with n-type impurities, the nitride 8 and the oxide 13 acting as a mask. Thus, the device shown in FIG. 22 is obtained.

Figure 24:
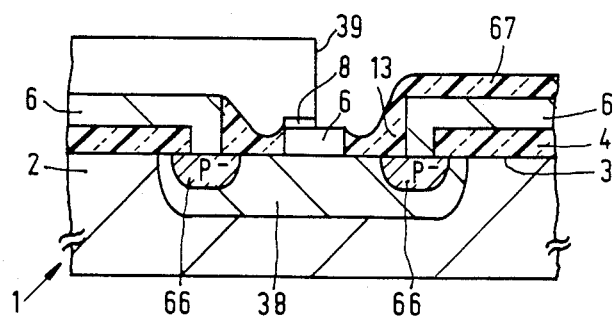

Subsequently, a photolacquer mask 39 is provided (FIG. 23), by means of which the nitride 8 is partly etched away. When an oxide layer 67 is applied, it is prevented that, during etching of the polycrystalline silicon 6 exposed within the depression, the remaining layers 6 are attacked. This may be effected, for example, by thermal oxidation with the doped polycrystalline silicon then oxidizing much more rapidly than the updoped polycrystalline silicon located within the depression, so that then the oxide grown within the depression on the polycrystalline layer 6 is removed again by means of a light etching treatment (FIG. 24). Before the oxidation step, the exposed layer 6 is doped with phosphorus.

Figure 25:
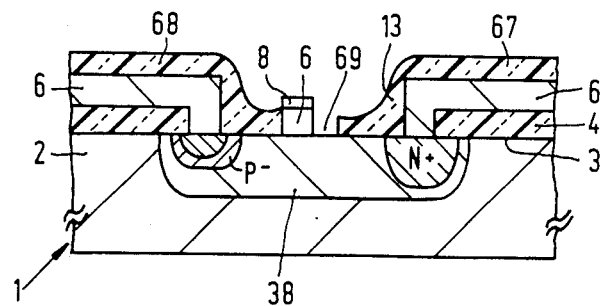

By means of the photolacquer layer 39 and the oxide 67 used as a mask, the exposed polycrystalline silicon 6 is then etched away down to the semiconductor surface 3, for example by means of plasma etching, the photolacquer layer 39 then being removed (FIG. 25).

Figure 26:
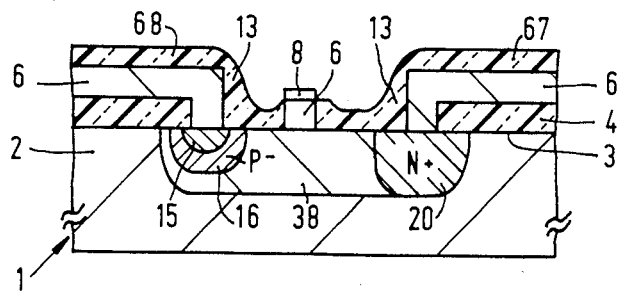

After the polycrystalline silicon layer 6 thus exposed has further been provided, for example, with an additional arsenic doping, an oxide layer 67 is formed on it, whereupon also the groove 69 just mentioned is closed by oxidation (FIG. 26). During the various oxidation steps, various kinds of impurities diffuse from the layers 6 into the semiconductor body and thus form the base zone 16, the emitter zone 15 and the collector contact zone 20.

Figure 27:
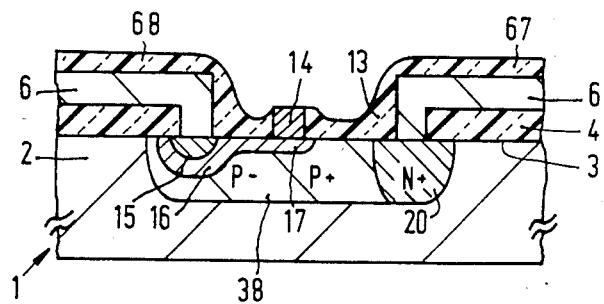
Figure 28:
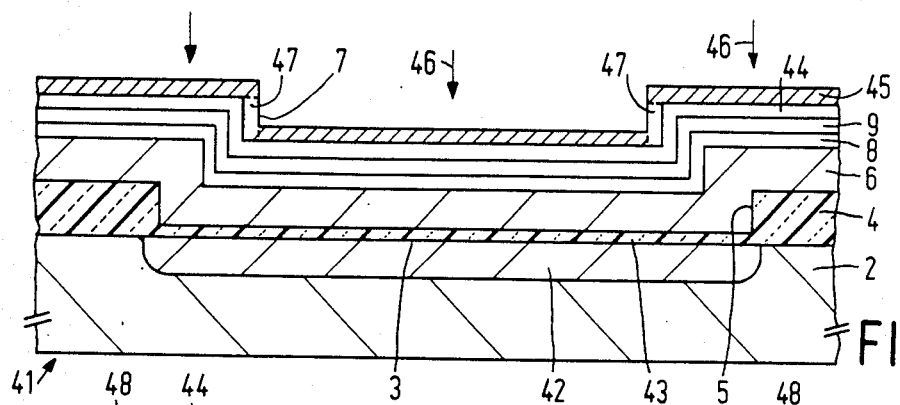
FIGS. 28 to 35 show the manufacture of a field effect transistor.
Figure 29:
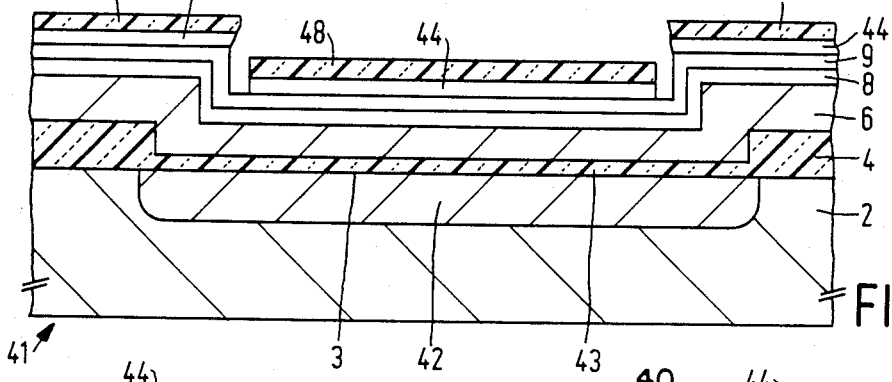
Figure 30:
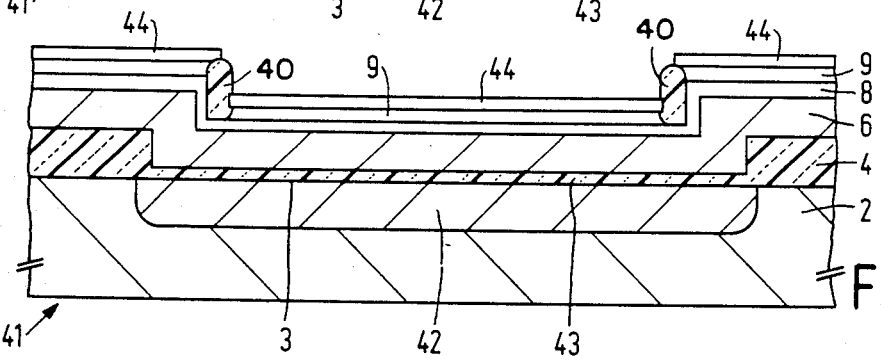

After the nitride 8 has been removed, the polycrystalline silicon 6 is doped with boron within the depression, which after diffusion into the semiconductor body 2 serves to form the base contact zone 17. Thus, the configuration of FIG. 27 is obtained, which after a metallization step substantially corresponds to that of FIG. 21 on the understanding that the base contact zone 17 is now located at a finite distance from the collector contact zone 20, which leads to a considerable reduction of the base-collector capacitance.

FIGS. 28 to 35 show a method of manufacturing a lateral field effect transistor, in which the grooves 11 are formed by means of a slightly different method.

The starting material is a device 41 having an n-type substrate region 2 and a masking layer 4 located on a surface 3 thereof. Within an opening 5, a p-type zone 42 is provided, for example by means of diffusion, while using the oxide 4 as a mask, the latter zone then being lightly oxidized to obtain a gate oxide 43. On the oxide 4 and within the opening 5 are again successively formed a layer 6 of polycrystalline silicon and a layer 8 of silicon nitride as well as a first convertible layer 9, in this case of polycrystalline silicon.

Subsequently, the assembly is covered by a substantially uniform layer 44 of oxidation-preventing material, in this case silicon nitride, and a second convertible layer 45 of polycrystalline silicon. Also in this case, the depression 7 is maintained in a manner similar to that in the preceding embodiments. The layer 45 is then selectively converted, which means in this case that an ion implantation with, for example, boron ions is carried out, as indicated diagrammatically by arrows 46. By means of the parts 47, the layer 45 thus becomes p-type conducting. The parts 47 at the area of the depression 7 are again readily soluble in potassium hydroxide, while the remaining part of the layer 45 is substantially not attacked thereby and forms an auxiliary mask after the parts 47 have been dissolved. In the present embodiment, the auxiliary mask may also be formed by oxidizing the remaining parts of the layer 45 to an auxiliary mask 48 of silicon oxide. While using this oxide 48 as a mask, the subjacent layer 44 of nitride is etched (see FIG. 29).

Figure 31:
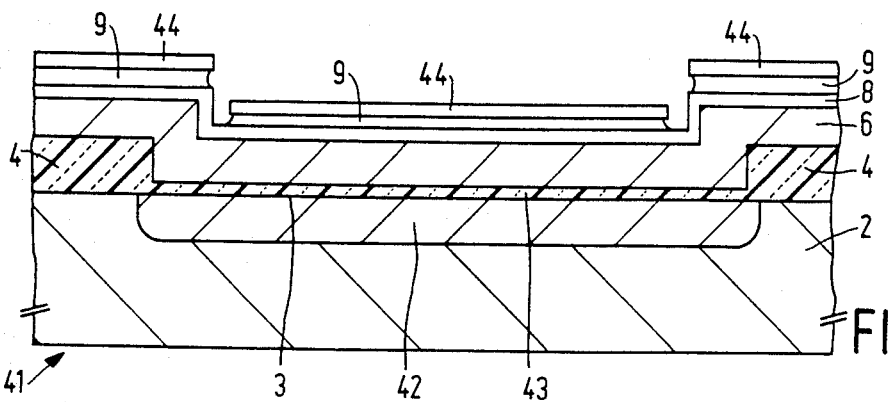
Figure 32:
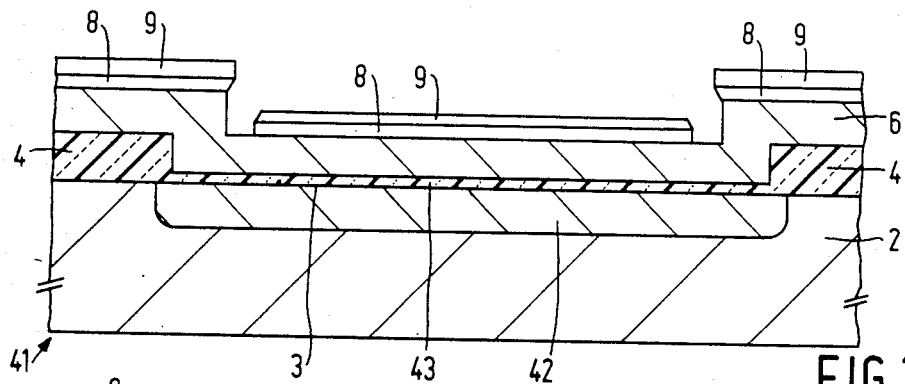
Figure 33:
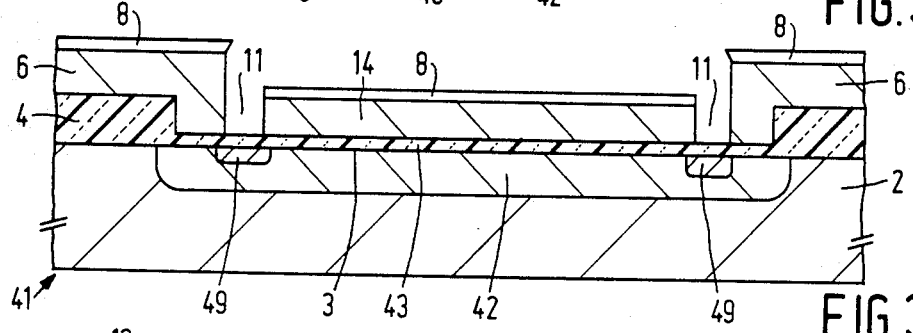

The remaining nitride 44 forms an oxidation mask in the following processing step, in which the polycrystalline silicon 9 is converted along the inner edge of the depression 7 into oxide 40 (see FIG. 30), which is then removed by a wet-chemical treatment. Thus, the device of FIG. 31 is obtained, in which the layer 9 of polycrystalline silicon again constitutes an intermediate mask for etching the subjacent nitride layer 8. In a next processing step, the exposed parts of the nitride layer 8 and the nitride layer 44 are removed by wet-chemical etching. Thus, the device of FIG. 32 is obtained.

While using the remaining nitride 8 as a mask, a groove 11 is etched down to the gate oxide 43 by anisotropic etching. The groove 11 encloses a region 14 of polycrystalline silicon. By this groove 11, an n-type region 49 is formed in the p-type region 42 by ion implantation (see FIG. 33).

Figure 34:
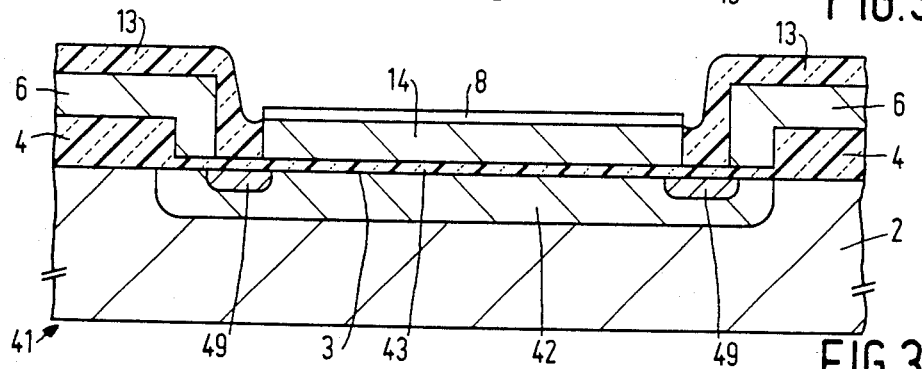

Subsequently, the whole device is again coated with photolacquer, which is planarized and is then etched back until the nitride on the layer 6 outside the depression is removed. After the remaining photolacquer has been removed, the groove 11 is closed by oxidation in a manner similar to that described with reference to FIGS. 1 to 6 so that the device of FIG. 34 is obtained with oxide 13 in the groove 11 and on the upper side of the polycrystalline silicon 6. During subsequent etching treatments, the remaining nitride 8 and the polycrystalline silicon 14 are successively removed. By means of a light dip-etching step in buffered HF, the exposed oxide 43 is then removed so that this oxide remains only at the area of the polycrystalline silicon 6 and the thermal oxide 13. Any oxide 43 damaged during the reactive ion etching is now situated below this oxide 13 and forms part of the insulation between the polycrystalline silicon layers 6 and a metallization 51 to be provided on the surface 3 (see FIG. 35). However, beforehand, while using the oxide 13 as a mask, an implanation step is carried out with ions which cause the n-conductivity type in order to obtain a region 50, which together with the region 49 forms the source zone of a field effect transistor, having a gate region constituted by the region 42 and whose gate electrode is constituted by the polycrystalline silicon 6, which is separated from the gate region 42 by the gate oxide 43. The n-type region 2 acts as the drain region and is connected through a highly doped n-type region 52 to a contact metallization 53.

Figure 35:
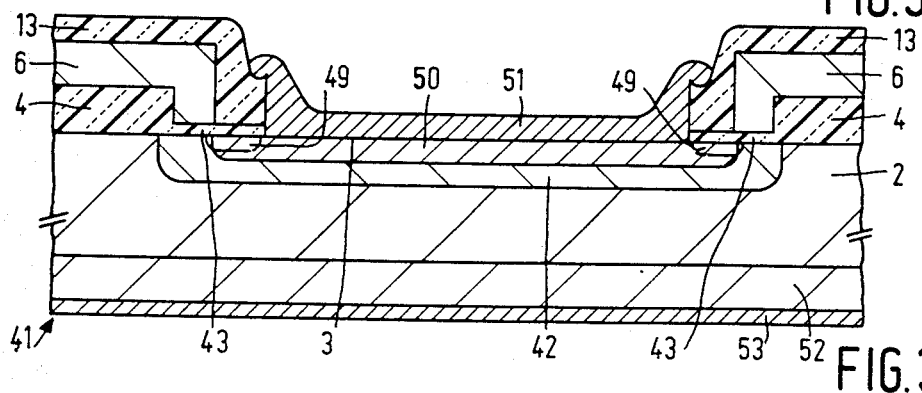

After the contact metallizations 51 and 53 have been provided in a conventional manner, the field effect transistor 41 of FIG. 35 is obtained. This field effect transistor has a channel region of very short channel length (for example 0.5 μm) having a surface concentration of acceptor atoms substantially equal throughout the area below the gate oxide.

Figure 36:
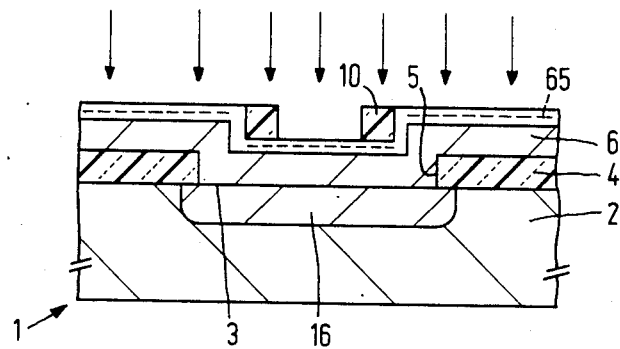
Figure 37:
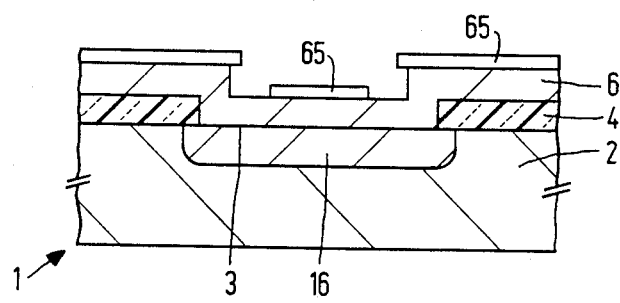
Figure 38:
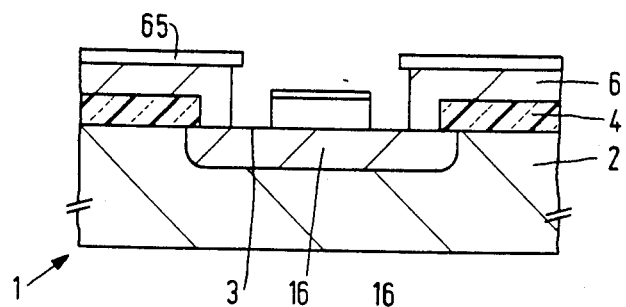

FIGS. 36 to 38 show a modification of the part of the method as shown in FIGS. 1 to 5.

The device 1 again comprises a semiconductor substrate 2 provided with a surface zone 16 and is provided at the major surface 3 with a first masking layer 4 of silicon oxide.

Again a substantially uniform layer 6 of polycrystalline silicon is formed on the substrate region 2 within the opening 5 in the layer 4 and on the adjoining oxide 4, but this layer is now covered at reduced pressure and at a temperature of 750° to 850° C. with a substantially uniform layer 65 of silicon nitride and then with a substantially uniform layer of silicon oxide, from which a mask 10 is obtained in the same manner as described with reference to FIG. 3.

The nitride layer 65 is now bombarded, for example, with arsenic ions. This implantation is carried out with an energy of 200 kV and a dose of $10^{14}$ ions/cm$^2$, after which the entire structure is subjected to a heat treatment of about 750° to 850° C. for 15 to 20 minutes.

The parts of the silicon nitride layer 65 irradiated by ions can be etched less satisfactorily than the parts protected by the mask 10, as described in the Netherlands Patent Application No. 8301262 filed on Apr. 11, 1983 by the applicant, corresponding to U.S. Pat. No. 4,514,241.

The parts of the layer 65 protected by the mask 10 are etched, after removal of this mask, in an aqueous solution containing about 4% by volume of hydrofluoride. Thus, the device of FIG. 37 is obtained. The layer 65 in this case plays the same part as the layers 8 and 9 in the embodiment of FIGS. 1 to 5. As appears from FIG. 37, while using the layer 65 as a mask, an anisotropic etching treatment can again be carried out, which results in the device of FIG. 38, with which in the same manner shown in FIGS. 5 to 8 a semiconductor device can be manufactured.

For obtaining the mask 65, the nitride layer may of course also be bombarded with, for example, nitrogen, antimony, boron, gallium, phosphorus, argon, krypton or xenon, as described more fully in the Netherlands Patent Application No. 8301262.

Such implantations are preferably carried out in a manner such that the ions penetrate as far as halfway through the layer 65 of silicon nitride nitride with the radiation doses being chosen between $10^{12}$ and $10^{15}$ ions/cm$^2$.

Figure 39:
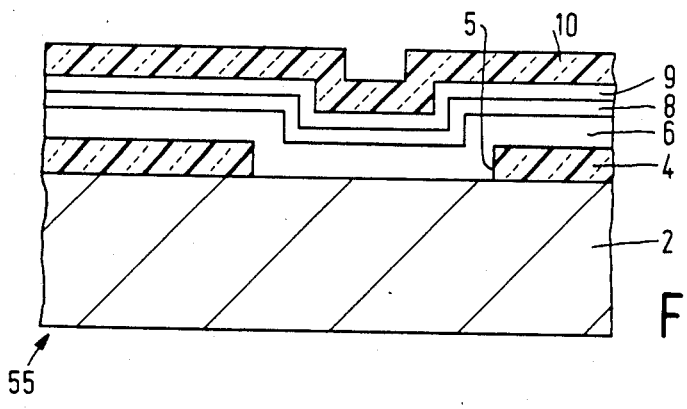
FIGS. 39 to 41 show the manufacture of a capacitor by means of a method according to the invention.
Figure 40:
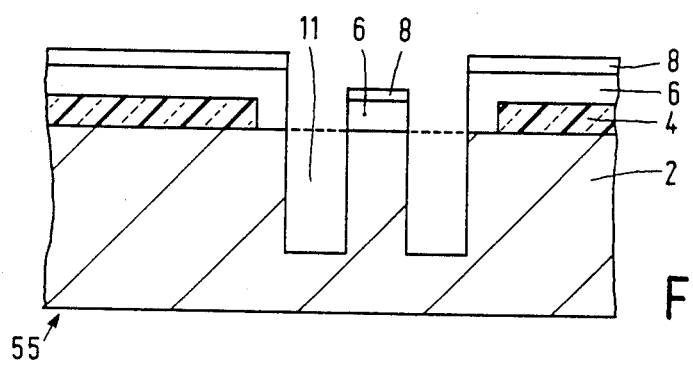
Figure 41:
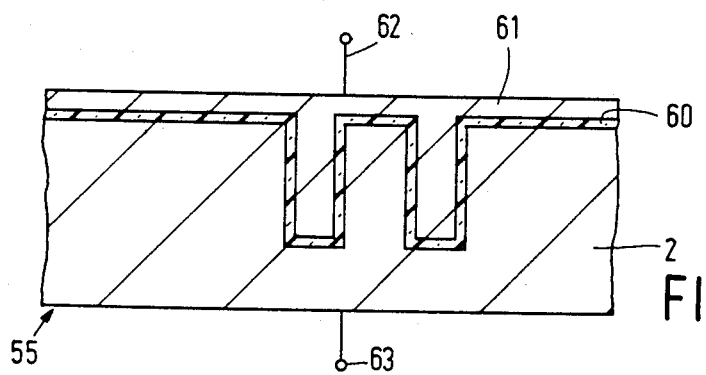

The method according to the invention may also be used for devices other than semiconductor devices, such as, for example, capacitors. For this purpose (see FIG. 39), the starting material is a substrate region 2 of tantalum, whose surface is covered by a mask 4 of tantalum oxide, which is obtained, for example, by oxidation of a surface layer of the tantalum, or by anodization, and then selective etching of this layer by means of reactive ion etching. The device 55 is then covered in the same manner as the device of FIG. 2 by a first convertible layer 6 of polycrystalline silicon, a second masking layer 8 of silicon nitride, a second convertible layer 9 of polycrystalline silicon and a masking layer 10. In the same manner as described with reference to FIGS. 3 to 5, again grooves 11 are formed (see FIG. 40) with the etching of the grooves being continued until they extend into the substrate region 2 of tantalum. After the remaining parts of the various layers have been removed from the surface, the substrate region 2, inclusive of the grooves 11, is covered by means of a light oxidation with a thin tantalum oxide layer 60; and a metal layer 61, for example aluminium, is formed on the entire surface (FIG. 41). A capacitor with a dielectric 60 is then obtained between the connection terminals 62 and 63. The overall effective surface area of the capacitor is strongly increased due to the presence of the grooves so that on the same substrate surface a considerably larger capacitance can be realized than in the absence of the grooves.

Figure 42:
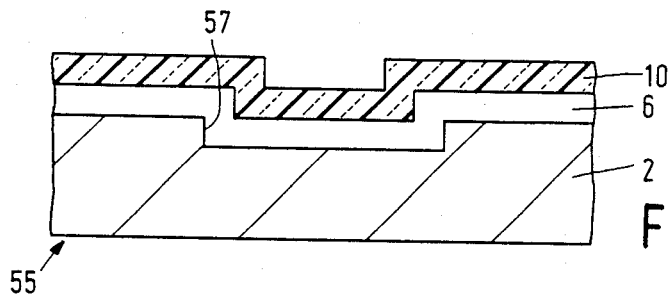
FIGS. 42 to 45 show a modification thereof.
Figure 43:
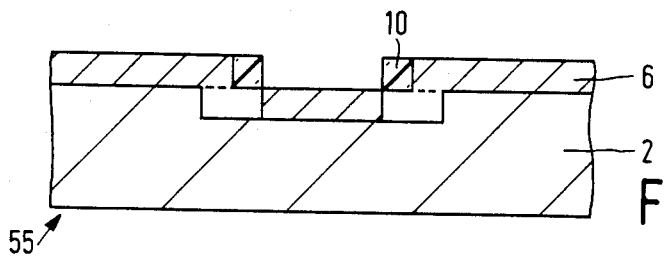
Figure 44:
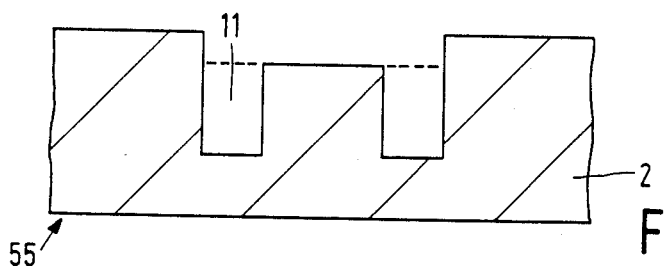
Figure 45:
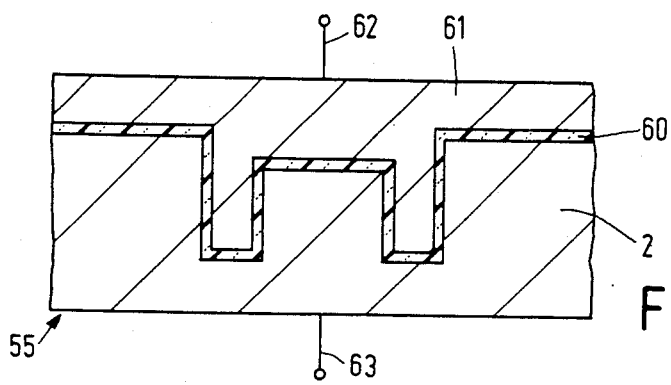

Such a capacitor may also be obtained by starting from a semiconductor substrate, in which depressions 57 are formed beforehand by selective reactive ion etching (see FIG. 42). The entire structure is covered by a convertible layer 6 of polycrystaline silicon and with a masking layer 10. After anisotropic etching of the masking layer 10 consisting of oxide, an oxide edge 10 remains in the depressions (FIG. 43) which protects the subjacent polycrystalline silicon 6 against conversion. After conversion (doping with phosphorus or silicidation) the edge 10 and then the non-converted polycrystalline silicon 6 are removed; the remaining polycrystalline silicon 6 then forms a mask for etching the grooves 11 (FIG. 44). The grooves and the surface are covered with a dielectric 60, after which a second metal layer 61 is formed and the capacitor if provided with connection terminals 62 and 63. Thus, the device of FIG. 45 is obtained.

Of course the invention is not limited to the embodiments described above, but many variations are possible for those skilled in the art without departing from the scope of the invention.

For example, the masking layer 4 may also be made of a double layer of nitride and oxide. The oxide 25 in FIG. 15 may be provided by local oxidation, but may also be provided by means of the method described in FIGS. 9 to 13. Moreover, the conductivity types can be inverted (simultaneously).

What is claimed is:

1. A method of forming at least one narrow groove in a substantially uniform layer of a material, said narrow groove having a width determined in a self-registering manner, said method comprising the steps of
   providing a first masking layer of a first masking material at a major surface of a substrate, said first masking layer having at least one opening or depression,
   providing a substantially uniform layer of a first material on said first masking layer, said layer of said first material having a first depression over said at least one opening or depression,
   providing a substantially uniform second masking layer of a second masking material on said layer of said first material, said second masking layer having a second depression over said first depression of said first material,
   providing a substantially uniform first convertible layer of a first convertible material, said first convertible layer being a polycrystalline semiconductor material on said second masking layer, said polycrystalline semiconductor layer having a third depression over said second depression of said second masking layer,
   providing a substantially uniform oxidation-preventing layer of oxidation-preventing material on said polycrystalline semiconductor layer, said oxidation-preventing layer having a fourth depression over said third depression of said polycrystalline semiconductor layer,
   providing a substantially uniform second convertible layer of a second convertible material on said oxidation-preventing layer, said second convertible layer having a fifth depression over said fourth depression of said oxidation-preventing layer,
   ion converting a portion of said second convertible layer into an auxiliary mask, second portions of said second convertible layer at sides of said fifth depression remaining said second convertible layer,
   removing said second portions of said second convertible layer and etching exposed portions of said oxidation-preventing layer at sides of said fourth depression to expose portions of said polycrystalline semiconductor layer, removing said auxiliary mask and oxidizing said exposed portions of said polycrystalline semiconductor layer at sides of said third depression using said oxidation-preventing layer as a mask, removing the oxidized exposed portions of said polycrystalline semiconductor layer, removing said oxidation-preventing layer and exposing portions of said second masking layer at sides of said second depression, etching the exposed portions of said second masking layer using said polycrystalline semiconductor layer as an intermediate mask, removing said polycrystalline semiconductor layer to expose said second masking layer, and etching at least one narrow groove through said first material at sides of said first depression using said second masking layer as a mask.

2. A method of forming at lesat one narrow groove in a substantially uniform layer of a material, said narrow groove having a width determined in a self-registering manner, said method comprising the steps of providing a first masking layer of a first masking material at a major surface of a substrate, said first masking layer having at least one opening or depression, providing a substantially uniform layer of a first material on said first masking layer, said layer of said first material having a first depression over said at least one opening or depression, providing a substantially uniform second masking layer of a second masking material on said layer of said first material, said second masking layer having a second depression over said first depression of said first material, providing a substantially uniform first convertible layer of a first convertible material on said second masking layer, said first convertible layer having a third depression over said second depression of said second masking layer, forming an intermediate mask from said first convertible material, said intermediate mask having an opening at sides of said third depression to expose said second masking layer etching exposed portions of said second masking layer at sides of said second depression and removing said intermediate mask, and etching at least one narrow groove through said first material at sides of said first depression using said second masking layer as a mask, wherein said intermediate mask is formed by the steps of providing a substantially uniform third masking layer of a third masking material on said first convertible layer, etching said third masking layer to form only edge covers on said first convertible layer at sides of said third depression, converting uncovered positions of said first convertible material into said intermediate mask, and removing said edge covers.

3. A method according to claim 2, wherein said first convertible layer is polycrystalline semiconductor material, and wherein said step of converting is carried out by highly ion implanting dopants into said first convertible layer, said highly doped layer remaining upon carrying out said steps of removing said edge covers.

4. A method according to claim 2 or claim 3, wherein said third masking layer includes one of silicon oxide, silicon nitride, aluminum oxide, an oxynitride, aluminum, platinum, tungsten, or molybdenum.

5. A method according to claim 4, wherein said polycrystalline semiconductor material acts as a doping source for doping impurities into said substrate.

6. A method according to claim 3, wherein said polycrystalline semiconductor material acts as a doping source for doping impurities into said substrate.

7. A method according to claim 3, wherein said third masking layer includes an oxidation-preventing layer, and wherein said semiconductor material of said first convertible layer is locally converted into oxide by local oxidation and remaining portions of said semiconductor material are removed by etching.

8. A method according to claim 3, wherein said semiconductor material of said first convertible layer is converted by silicidation into a silicide except along an inner edge of said third depression, said silicide substantially remaining during said step of removing said edge covers.

9. A method according to claim 8, wherein said silicide is one of platinum, tungsten or molybdenum.

10. A method according to claim 3, wherein said semiconductor material of said first convertible layer is converted by oxidation into oxide at least along a portion of an inner edge of said third depression, said oxide being removed so that remaining portions of said semiconductor material constitute said intermediate mask.

11. A method of providing at least one narrow groove in a substantially uniform layer of a material, said groove having a width determined in a self-registered manner, said method comprising the steps of providing a first masking layer on a major surface of a substrate, said first making layer having at least one opening, providing a substantially uniform first layer of a first material over said at least one opening and adjoining parts of said first masking layer, said layer of said first material having a depression at said opening, providing a substantially uniform second masking layer of a second masking material over said first layer of said first material, said second masking layer having a depression at said opening, selectively converting said second masking layer so that a portion along an inner edge of said depression is removed from said second masking layer to form a mask, and forming by etching a narrow groove in said first layer of said first material by using said mask, wherein said second masking layer is covered by a substantially uniform third masking layer of a third masking material, said third masking layer being selectively etched to maintain a portion of said third masking layer at least along said inner edge of said depression of said second masking layer, said portion of said third masking layer protecting said second masking layer from said step of selectively converting.

12. A method according to claim 11, wherein said second masking layer includes silicon nitride, and wherein ions are implanted over part of a surface of said silicon nitride, said silicon nitride being subjected to a heat treatment after implantation of said ions but before said step of etching, said ion implanted part of said silicon nitride layer being more resistant to etching than non-ion implanted parts of said silicon nitride.

13. A method according to claim 11 or claim 12, wherein said etching is continued to form said narrow groove into said substrate.

14. A method according to claim 13, wherein said substrate is a semiconductor region, and wherein said groove is at least partially filled.

15. A method according to claim 11 or claim 12, wherein said narrow groove is formed by etching with constituents of a plasma.

16. A method according to claim 11 or claim 12, wherein said first layer includes a semiconductor material, and said first masking layer includes a material protecting said semiconductor material from oxidation, wherein after said narrow groove has been etched through said first layer, said material of said first masking layer away from said opening for protecting against oxidation is removed, and wherein said narrow groove is filled with an oxide obtained by oxidizing said semiconductor material.

17. A method according to claim 16, wherein said narrow groove is substantially filled with said oxide before said material protecting against oxidation is removed.

18. A method according to claim 17, wherein after said narrow groove has been closed by said oxide, at least a part of said first layer of said first material within said depression is removed down to said major surface of said substrate, and wherein space thus obtained is filled with oxide.

19. A method according to claim 18, wherein said narrow groove encloses a semiconductor region within said depression, and wherein parts of said first layer are maintained at least along edges of said depression.

20. A method according to claim 19, wherein said semiconductor region enclosed by said narrow groove and said parts of said first layer are doped along said edges of said depression with impurities to cause opposite conductivity types, said impurities forming an emitter zone of one conductivity type, and a base contact zone of a second opposite conductivity type, such that a bipolar transistor is formed.

21. A method according to claim 19, wherein said semiconductor region enclosed by said narrow groove and said parts of said first layer are doped with impurities to cause opposite conductivity types, said impurities forming a base contact zone, a base zone, an emitter zone, and a collector contact zone, respectively, such that a bipolar transistor is formed.

22. A method according to claim 19, wherein said major surface within said opening of said first masking layer is provided with gate oxide, and wherein after said narrow groove has been closed by said oxide, said semiconductor region enclosed by said narrow groove and said gate oxide lying below said semiconductor region are removed, such that a MOS transistor is formed.

23. A method according to claim 22, wherein said substrate is a material of one conductivity type, wherein a gate region of said gate oxide is formed of an opposite conductivity type within said opening at the area of said narrow groove, and wherein said semiconductor region enclosed by said narrow groove is provided with a source region of said one conductivity type.

24. A method according to claim 17, wherein said narrow groove encloses a semiconductor region within said depression, and wherein parts of said first layer are maintained at least along edges of said depression.

25. A method according to claim 24, wherein said semiconductor region enclosed by said narrow groove and said parts of said first layer are doped along said edges of said depression with impurities to cause opposite conductivity types, said impurities forming an emitter zone of one conductivity type, and a base contact zone of a second oppposite conductivity type, such that a bipolar transistor is formed.

26. A method according to claim 24, wherein said semiconductor region enclosed by said narrow groove and said parts of said first layer are doped with impurities to cause opposite conductivity types, said impurities forming a base contact zone, a base zone, an emitter zone, and a collector contact zone, respectively, such that a bipolar transistor is formed.

27. A method according to claim 24, wherein said major surface within said opening of said first masking layer is provided with gate oxide, and wherein after said narrow groove has been closed by said oxide, said semiconductor region enclosed by said narrow groove and said gate oxide lying below said semiconductor region are removed, such that a MOS transistor is formed.

28. A method according to claim 27, wherein said substrate is a material of one conductivity type, wherein a gate region of said gate oxide is formed of an opposite conductivity type within said opening at the area of said narrow groove, and wherein said semiconductor region enclosed by said narrow groove is provided with a source region of said one conductivity type.

29. A method according to claim 16, wherein after said narrow groove has been closed by said oxide, at least a part of said first layer of said first material within said depression is removed down to said major surface of said substrate, and wherein space thus obtained is filled with oxide.

30. A method according to claim 16, wherein said narrow groove encloses a semiconductor region within said depression, and wherein parts of said first layer are maintained at least along edges of said depression.

31. A method according to claim 30, wherein said semiconductor region enclosed by said narrow groove and said parts of said first layer are doped along said edges of said depression with impurities to cause opposite conductivity types, said impurities forming an emitter zone of one conductivity type, and a base contact zone of a second opposite conductivity type, such that a bipolar transistor is formed.

32. A method according to claim 30, wherein said semiconductor region enclosed by said narrow groove and said parts of said first layer are doped with impurities to cause opposite conductivity types, said impurities forming a base contact zone, a base zone, an emitter zone, and a collector contact zone, respectively, such that a bipolar transistor is formed.

33. A method according to claim 30, wherein said major surface within said opening of said first masking layer is provided with gate oxide, and wherein after said narrow groove has been closed by said oxide, said semiconductor region enclosed by said narrow groove and said gate oxide lying below said semiconductor region are removed, such that a MOS transistor is formed.

34. A method according to claim 33, wherein said substrate is a material of one conductivity type, wherein a gate region of said gate oxide is formed of an opposite conductivity type within said opening at the area of said narrow groove, and wherein said semiconductor region enclosed by said narrow groove is provided with a source region of said one conductivity type.

35. A method of manufacturing a capacitor comprising the steps of forming at least one depression in a major surface of a substrate of conductive material, said depression having edges substantially at right angles to said major surface, covering said depression and said major surface with a convertible layer forming a mask by selectively converting said convertible layer to form openings to said major surfaces within said depression, etching grooves into said conductive material through said opening of said mask, removing said mask, covering said conductive material in said grooves and on said major surface with a dielectric, and covering said dielectric within said grooves and on said major surface with a second conductive material.

* * * * *